(12) United States Patent
Hwang et al.

(10) Patent No.: US 9,994,735 B2
(45) Date of Patent: Jun. 12, 2018

(54) SLURRY COMPOSITION FOR POLISHING TUNGSTEN

(71) Applicant: K.C. Tech Co., Ltd., Anseong-si (KR)

(72) Inventors: Jin Sook Hwang, Anseong-si (KR); Hyun Goo Kong, Anseong-si (KR); Han Teo Park, Anseong-si (KR)

(73) Assignee: KCTECH CO., LTD., Anseong-si (KR)

( * ) Notice: Subject to any disclaimer, the term of this patent is extended or adjusted under 35 U.S.C. 154(b) by 0 days. days.

(21) Appl. No.: 15/189,190

(22) Filed: Jun. 22, 2016

(65) Prior Publication Data

US 2017/0009353 A1 Jan. 12, 2017

(30) Foreign Application Priority Data

Jul. 9, 2015 (KR) .................. 10-2015-0097537

(51) Int. Cl.
| | |
|---|---|
| *C09K 13/00* | (2006.01) |
| *C03C 15/00* | (2006.01) |
| *C03C 25/68* | (2006.01) |
| *H01L 21/302* | (2006.01) |
| *H01L 21/461* | (2006.01) |
| *C09G 1/02* | (2006.01) |
| *C09K 3/14* | (2006.01) |
| *H01L 21/321* | (2006.01) |
| *H01L 21/306* | (2006.01) |
| *C23F 3/06* | (2006.01) |
| *C23F 1/10* | (2006.01) |

(52) U.S. Cl.
CPC .................. *C09G 1/02* (2013.01); *C09K 3/14* (2013.01); *C09K 13/00* (2013.01); *C23F 3/06* (2013.01); *H01L 21/30625* (2013.01); *H01L 21/32115* (2013.01); *C23F 1/10* (2013.01)

(58) Field of Classification Search
None
See application file for complete search history.

(56) References Cited

U.S. PATENT DOCUMENTS

| | | | | |
|---|---|---|---|---|
| 2005/0236601 A1* | 10/2005 | Liu | .......................... | C09G 1/02 252/79.1 |
| 2007/0093187 A1* | 4/2007 | Takenouchi | ............. | C09G 1/02 451/174 |
| 2010/0197201 A1* | 8/2010 | Nomura | ................... | C09G 1/02 451/36 |
| 2012/0270400 A1* | 10/2012 | Takegoshi | ................ | C09G 1/02 438/692 |

FOREIGN PATENT DOCUMENTS

| | | |
|---|---|---|
| CN | 1688665 | 10/2005 |
| CN | 1939993 A | 4/2007 |
| CN | 101978019 | 2/2011 |
| CN | 104285284 A | 1/2015 |
| CN | 105018030 | 11/2015 |
| KR | 10-2010-0065304 | 6/2010 |
| KR | 10-2010-0070530 A | 6/2010 |
| TW | 200916608 A | 4/2009 |

* cited by examiner

*Primary Examiner* — Stephanie P Duclair
(74) *Attorney, Agent, or Firm* — Oblon, McClelland, Maier & Neustadt, L.L.P.

(57) ABSTRACT

A slurry composition for polishing tungsten is provided. The slurry composition for polishing tungsten may include a water-soluble polymer, abrasive particles and an etching adjuster.

18 Claims, 2 Drawing Sheets

SLURRY COMPOSITION FOR POLISHING TUNGSTEN

CROSS-REFERENCE TO RELATED APPLICATION

This application claims the benefit of Korean Patent Application No. 10-2015-0097537, filed on Jul. 9, 2015, in the Korean Intellectual Property Office, the disclosure of which is incorporated herein by reference.

BACKGROUND

1. Field of the Invention

Embodiments relate to a slurry composition for polishing tungsten.

2. Description of the Related Art

With a decrease in design rules for products, a width decreases and a height increases in a structure, and accordingly an aspect ratio, that is, a depth/bottom width ratio is drastically increasing. Also, an influence of scratches occurring in a 30-nanometer semiconductor process is at least two times higher than an influence of scratches occurring in a 50-nanometer semiconductor process according to a related art. Thus, not only scratches but topography also has sensitive effects on a surface of a film. A polishing amount and a quality of a polished surface are regarded as crucial factors in a polishing process. Importance of a quality of a polished surface is maximized based on a decrease in design rules for semiconductors in recent years, and accordingly a polishing process for the quality of the polished surface tends to be added.

Recently, lower current leakage is required based on an increase in integration of a semiconductor. To satisfy such a requirement, a structure of a dielectric with a high dielectric constant and a metal gate is designed. Generally, aluminum is frequently used as a metal gate material. The decrease in design rules makes it difficult to completely deposit and polish aluminum oxide with a high hardness, and thus extensive studies on use of tungsten as a gate material are recently conducted. However, as a constituent material of a gate is changed from aluminum to tungsten, tungsten topographies are formed due to a particle size of tungsten crystals after deposition, which causes an undesired short circuit between metals to reduce a semiconductor yield. To improve a quality of a polished surface of tungsten, that is, to improve topography, polishing is essential for a next-generation process. A slurry composition in which the topography is not improved causes over-etching or un-etching of tungsten in a post-polishing process to bring about process defects or to make an operation of a device unstable, thereby drastically reducing a semiconductor yield. In addition, because a chemical etching speed increases due to physicochemical polishing performed even though an organic acid is not added, a surface of a tungsten film is uneven and has surface defects, for example, dishing or erosion. Thus, a secondary issue, for example, corrosion of a tungsten surface or a change in a tungsten film, may occur.

SUMMARY

Embodiments provide a slurry composition for polishing tungsten that may improve topography of a tungsten film by reducing surface defects, for example, dishing or erosion, caused by the topography of the tungsten film and by controlling a roughness of a surface of the tungsten film.

However, the problems to be solved in the present disclosure are not limited to the foregoing problems, and other problems not mentioned herein would be clearly understood by one of ordinary skill in the art from the following description.

According to an aspect, there is provided a slurry composition for polishing tungsten including a water-soluble polymer, abrasive particles and an etching adjuster.

The water-soluble polymer may include at least one of polystyrene sulfonic acid, polyvinyl sulfonic acid, polyacrylamide methylpropane sulfonic acid, poly-α-methylstyrene sulfonic acid, poly-ρ-methylstyrene sulfonic acid and salts thereof.

The water-soluble polymer may be present in an amount of 0.01% by weight (wt %) to 5 wt % in the slurry composition.

The abrasive particles may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia.

The abrasive particles may have a particle size of 20 nanometers (nm) to 250 nm, and may include abrasive particles having the same particle size or at least two different particle sizes.

The abrasive particles may be present in an amount of 1 wt % to 5 wt % in the slurry composition.

The etching adjuster may be a compound having a hydrophilic index (HPI) value equal to or less than "70," or a compound having a hydrophobic index (HBI) value equal to or greater than "30." The HPI value and the HBI value may be defined by Equations 1 and 2 shown below, respectively.

$$HPI = \frac{\text{Molecular weight of hydrophilic functional group}}{\text{Total Molecular weight of compound}} \times 100 \quad \text{[Equation 1]}$$

$$HBI = \frac{\text{Molecular weight of hydrophobic functional group}}{\text{Total Molecular weight of compound}} \times 100 \quad \text{[Equation 2]}$$

The etching adjuster may include at least one of lactic acid, propionic acid, isovaleric acid, caproic acid, isobutyric acid, valeric acid, butyric acid, cyclopentanecarboxylic acid, hydroxybutyric acid, 4-amino-3-hydroxybutyric acid, dimethyl succinic acid, methylpentanoic acid, 2-hydroxy-4-methylpentanoic acid and 1-hydroxy-1-cyclopropanecarboxylic acid.

The etching adjuster may be present in an amount of 0.001 wt % to 1 wt % in the slurry composition.

The slurry composition may further include at least one oxidizer selected from hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium persulfate, benzoyl peroxide, calcium peroxide, barium peroxide, sodium peroxide and urea peroxide.

The oxidizer may be present in an amount of 0.005 wt % to 5 wt % in the slurry composition.

The slurry composition may further include at least one pH adjuster selected from an acidic material including at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof, and a basic material including at least one of ammonia, ammonium methyl propanol (AMP), tetramethylammonium hydroxide (TMAH), potassium hydroxide, sodium hydroxide, magnesium hydroxide, rubidium hydroxide, cesium hydroxide, sodium hydrogen carbonate, sodium carbonate and imidazole.

The slurry composition may have a pH ranging from 2 to 5.

The slurry composition may be free of nitric acid.

A static etch rate (SER) of a surface of tungsten polished using the slurry composition may be equal to or less than 150 angstroms per minute (Å/min).

A peak-to-valley roughness Rpv of a surface of tungsten polished using the slurry composition may be equal to or less than 100 nm, and a root mean square roughness Rq of the surface may be equal to or less than 10 nm.

The slurry composition may be used to improve topography of tungsten.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
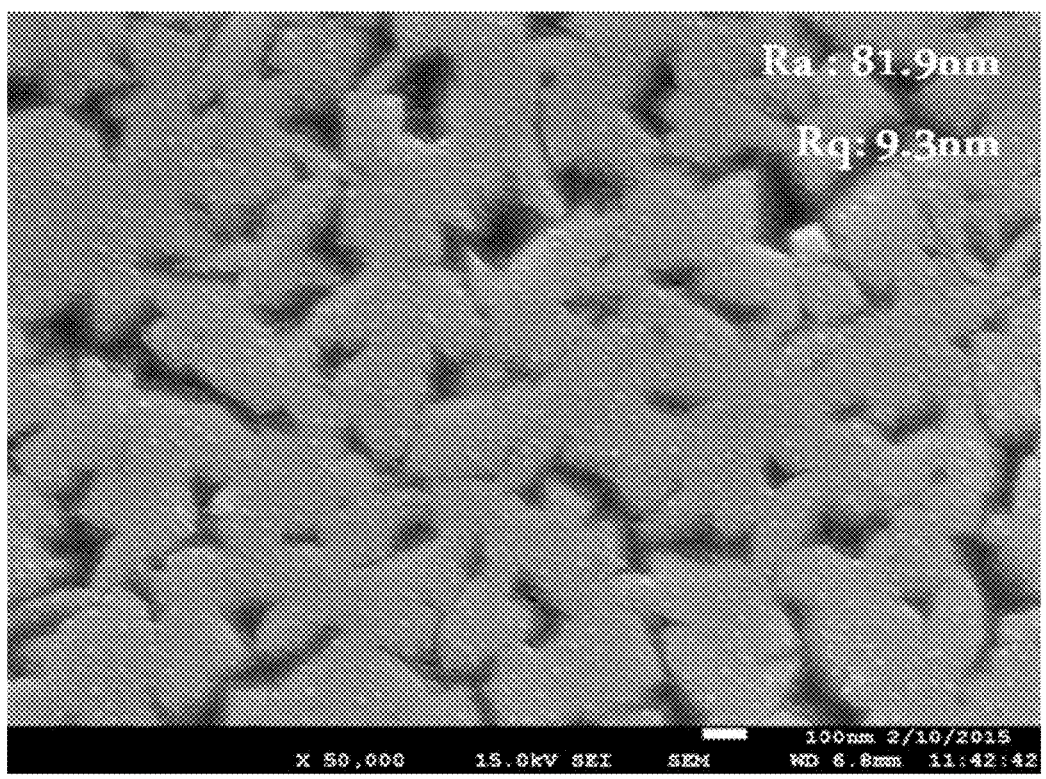
FIG. 1 illustrates a topographic image of a surface of a tungsten wafer polished using a slurry composition of Comparative Example 1 according to an embodiment.

Hereinafter, embodiments of the present disclosure will be described in detail with reference to the accompanying drawings. When it is determined detailed description related to a related known function or configuration they may make the purpose of the present disclosure unnecessarily ambiguous in describing the present disclosure, the detailed description will be omitted here. Also, terms used herein are defined to appropriately describe the embodiments and thus may be changed depending on a user, the intent of an operator, or a custom. Accordingly, the terms must be defined based on the following overall description of this specification. Like reference numerals present in the drawings refer to the like elements throughout.

It will be understood throughout the whole specification that, unless specified otherwise, when one part "includes" or "comprises" one component, the part does not exclude other components but may further include the other components.

Hereinafter, a slurry composition for polishing tungsten will be described in detail with reference to embodiments and drawings. However, the present disclosure is not limited to these embodiments and drawings.

According to an embodiment, a slurry composition for polishing tungsten (hereinafter, referred to as a "slurry composition") may include a water-soluble polymer, abrasive particles, and an etching adjuster.

Viewed from a side, topography of a tungsten film has uneven conical shapes. Unlike a slurry composition for improving topography of tungsten according to a related art, a slurry composition according to an embodiment may remove only topographies of tungsten and avoid waste of tungsten due to excessive polishing.

The water-soluble polymer may be a sulfur containing compound having a weight average molecular weight equal to or less than "1,000,000," and desirably, a sulfur containing compound having a weight average molecular weight of "25,000" to "1,000,000." When the weight average molecular weight of the water-soluble polymer exceeds "1,000,000," solubility, particle dispersion stability and polishing characteristics may be reduced.

The water-soluble polymer may include sulfonic acid and a salt or derivative thereof. For example, the water-soluble polymer may include at least one of polystyrene sulfonic acid, polyvinyl sulfonic acid, polyacrylamide methylpropane sulfonic acid, poly-α-methylstyrene sulfonic acid, poly-ρ-methylstyrene sulfonic acid and salts thereof.

The water-soluble polymer may be present in an amount of 0.01% by weight (wt %) to 5 wt % in the slurry composition. When the amount of the water-soluble polymer is less than 0.01 wt % in the slurry composition, adsorbability may decrease. When the amount of the water-soluble polymer exceeds 5 wt %, a tungsten polishing rate may decrease.

The abrasive particles may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia.

The abrasive particles may have a particle size of 20 nanometers (nm) to 250 nm, and may include abrasive particles having the same particle size or at least two different particle sizes. When the size of the abrasive particles is less than 20 nm, a polishing speed may decrease. When the size of the abrasive particles exceeds 250 nm, polishing may be excessively performed.

The size of the abrasive particles may be adjusted by adjusting calcination conditions and/or milling conditions. A bimodal particle size distribution may be obtained by mixing two types of abrasive particles, or a particle size distribution with three peaks may be obtained by mixing three types of abrasive particles. Because relatively large abrasive particles and relatively small abrasive particles may be mixed, the slurry composition may have superior dispersibility and an effect of reducing scratches on a wafer surface may be expected.

The abrasive particles may be present in an amount of 1 wt % to 5 wt % in the slurry composition. When the amount of the abrasive particles is less than 1 wt % in the slurry composition, the polishing speed may decrease. When the amount of the abrasive particles exceeds 5 wt %, the polishing speed may significantly increase, and surface defects may be caused by adsorbability of particles remaining on a surface due to an increase in a number of abrasive particles.

The etching adjuster may be a compound having a hydrophilic index (HPI) value equal to or less than "70" or a compound having a hydrophobic index (HBI) value equal to or greater than "30." A sum of the HPI value and the HBI value in the etching adjuster may be "100."

The HPI value may be defined by Equation 1 shown below.

$$HPI = \frac{\text{Molecular weight of hydrophilic functional group}}{\text{Total Molecular weight of compound}} \times 100 \quad \text{[Equation 1]}$$

The HBI value may be defined by Equation 2 shown below.

$$HBI = \frac{\text{Molecular weight of hydrophobic functional group}}{\text{Total Molecular weight of compound}} \times 100 \quad \text{[Equation 2]}$$

When the HPI value exceeds "70" or the HBI value is less than "30" in the etching adjuster, surface defects, for example, dishing or erosion, may occur due to an increase in an etching speed and dispersion stability of a slurry may decrease.

The etching adjuster may include at least one of lactic acid, propionic acid, isovaleric acid, caproic acid, isobutyric acid, valeric acid, butyric acid, cyclopentanecarboxylic acid, hydroxybutyric acid, 4-amino-3-hydroxybutyric acid, dimethyl succinic acid, methylpentanoic acid, 2-hydroxy-4-methylpentanoic acid and 1-hydroxy-1-cyclopropanecarboxylic acid.

The etching adjuster may be present in an amount of 0.001 wt % to 1 wt % in the slurry composition. When the amount of the etching adjuster is less than 0.001 wt % in the slurry composition, a surface roughness may increase due to a high chemical etching speed, and dishing or erosion of a surface may occur and it may be difficult to perform planarization of the surface because the surface is not evenly polished. When the amount of the etching adjuster exceeds 1 wt %, the polishing speed may be reduced due to an extremely low chemical etching speed.

The slurry composition may further include an oxidizer. The oxidizer may be added in manufacturing of the slurry composition, or may be added immediately before polishing. The oxidizer may include at least one of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium persulfate, benzoyl peroxide, calcium peroxide, barium peroxide, sodium peroxide and urea peroxide.

The oxidizer may be present in an amount of 0.005 wt % to 5 wt % in the slurry composition. When the amount of the oxidizer is less than 0.005 wt % in the slurry composition, a polishing speed and etching speed of tungsten may decrease. When the amount of the oxidizer exceeds 5 wt %, an oxide film on the tungsten surface may become hard so that polishing may not be smoothly performed and the oxide film may grow to cause corrosion and erosion of tungsten, thus resulting in inferior topography.

The slurry composition may further include at least one pH adjuster to prevent corrosion of a metal or abrader and to realize a pH range in which metal is easily oxidized. The pH adjuster may include, for example, an acidic material including at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof, and a basic material including at least one of ammonia, ammonium methyl propanol (AMP), tetramethylammonium hydroxide (TMAH), potassium hydroxide, sodium hydroxide, magnesium hydroxide, rubidium hydroxide, cesium hydroxide, sodium hydrogen carbonate, sodium carbonate and imidazole.

The slurry composition may have a pH ranging from 2 to 5. When the pH of the slurry composition is out of the above range, a polishing speed of a metal film may decrease, a surface roughness may be variable, and defects, for example, corrosion, erosion, dishing or surface unevenness, may occur. To adjust the pH, the pH adjuster may be added.

The slurry composition may be free of nitric acid and may not include nitric acid. When the slurry composition includes nitric acid, chemical etching may be excessively performed, and surface defects, for example, dishing or erosion, may occur on a tungsten surface.

A static etch rate (SER) of a surface of tungsten polished using the slurry composition may be equal to or less than 150 angstroms per minute (Å/min). For example, the SER may be calculated by immersing a tungsten wafer in a slurry composition for polishing tungsten at 60° C. for 10 minutes, by washing the tungsten wafer and by measuring a thickness of the tungsten wafer before and after the immersing using a four point probe of the tungsten wafer at an interval of 5 millimeters (mm) from a center of the tungsten wafer to up, down, right and left sides. The SER may be calculated in Å/min by Equation 3 shown below.

$$SER = \frac{\text{Thickness of wafer before immersion} - \text{Thickness of wafer after immersion}}{10} \quad \text{[Equation 3]}$$

A peak-to-valley roughness Rpv of a surface of tungsten polished using the slurry composition may be equal to or less than 100 nm, and a root mean square roughness Rq of the surface may be equal to or less than 10 nm. The peak-to-valley roughness and root mean square roughness may be measured with a scanning probe microscope.

The slurry composition may be used to improve topography of tungsten, may increase a yield affected by metal short circuits and etching defects caused by the topography and may enable a next-generation high integration process. Also, the slurry composition may significantly reduce surface defects, for example, erosion, dishing and formation of residues of a metal layer on a surface of an object to be polished.

Hereinafter, the present disclosure will be described in detail with reference to examples and comparative examples. However, the technical idea of the present disclosure is not limited or restricted to the examples.

EXAMPLES

Example 1

A slurry composition for polishing tungsten with pH of 2.8 was prepared by mixing 3 wt % of colloidal silica abrasive particles with a particle size of 120 mm, 0.5 wt % of polyvinyl sulfonic acid (PVSA) as a water-soluble polymer, 0.5 wt % of lactic acid as an etching adjuster, and 0.5 wt % of hydrogen peroxide as an oxidizer, and by using ammonia as a pH adjuster.

Example 2

A slurry composition was prepared in the same manner as in Example 1 except that an amount of the PVSA was changed to 0.01 wt %.

Example 3

A slurry composition was prepared in the same manner as in Example 1 except that an amount of the PVSA was changed to 0.6 wt %.

Example 4

A slurry composition was prepared in the same manner as in Example 1 except that an amount the lactic acid was changed to 0.01 wt %.

Example 5

A slurry composition was prepared in the same manner as in Example 1 except that an amount the lactic acid was changed to 0.2 wt %.

Example 6

A slurry composition was prepared in the same manner as in Example 1 except that the pH was changed to 3.5.

Examples 7 Through 12

Slurry compositions were prepared in the same manner as in Examples 1 through 6 except that 4-amino-3-hydroxybutyric acid was used as an etching adjuster.

Examples 13 Through 18

Slurry compositions were prepared in the same manner as in Examples 1 through 6 except that propionic acid was used as an etching adjuster.

Examples 19 Through 24

Slurry compositions were prepared in the same manner as in Examples 1 through 6 except that 2-hydroxybutyric acid was used as an etching adjuster.

Examples 25 Through 30

Slurry compositions were prepared in the same manner as in Examples 1 through 6 except that 1-hydroxy-1-cyclopropanecarboxylic acid was used as an etching adjuster.

HPI values and HBI values for Examples 1 through 30 are shown in Table 1 below.

TABLE 1

|  | HPI of organic acid | HBI of organic acid |
| --- | --- | --- |
| Example 1 | 68.8 | 31.2 |
| Example 2 | 68.8 | 31.2 |
| Example 3 | 68.8 | 31.2 |
| Example 4 | 68.8 | 31.2 |
| Example 5 | 68.8 | 31.2 |
| Example 6 | 68.8 | 31.2 |
| Example 7 | 65.5 | 34.5 |
| Example 8 | 65.5 | 34.5 |
| Example 9 | 65.5 | 34.5 |
| Example 10 | 65.5 | 34.5 |
| Example 11 | 65.5 | 34.5 |
| Example 12 | 65.5 | 34.5 |
| Example 13 | 60.7 | 39.3 |
| Example 14 | 60.7 | 39.3 |
| Example 15 | 60.7 | 39.3 |
| Example 16 | 60.7 | 39.3 |
| Example 17 | 60.7 | 39.3 |
| Example 18 | 60.7 | 39.3 |
| Example 19 | 59.6 | 40.4 |
| Example 20 | 59.6 | 40.4 |
| Example 21 | 59.6 | 40.4 |
| Example 22 | 59.6 | 40.4 |
| Example 23 | 59.6 | 40.4 |
| Example 24 | 59.6 | 40.4 |
| Example 25 | 60.7 | 39.3 |
| Example 26 | 60.7 | 39.3 |
| Example 27 | 60.7 | 39.3 |
| Example 28 | 60.7 | 39.3 |
| Example 29 | 60.7 | 39.3 |
| Example 30 | 60.7 | 39.3 |

COMPARATIVE EXAMPLE

Comparative Examples 1 Through 6

Slurry compositions were prepared in the same manner as in Examples 1 through 6 except that glycolic acid was added instead of the lactic acid used as an etching adjuster.

Comparative Examples 7 Through 12

Slurry compositions were prepared in the same manner as in Examples 1 through 6 except that citric acid was added instead of the lactic acid used as an etching adjuster.

Comparative Examples 13 Through 18

Slurry compositions were prepared in the same manner as in Examples 1 through 6 except that malonic acid was added instead of the lactic acid used as an etching adjuster.

HPI values and HBI values for Comparative Examples 1 through 18 are shown in Table 2 below.

TABLE 2

|  | HPI of organic acid | HBI of organic acid |
| --- | --- | --- |
| Comparative Example 1 | 98.6 | 1.4 |
| Comparative Example 2 | 98.6 | 1.4 |
| Comparative Example 3 | 98.6 | 1.4 |
| Comparative Example 4 | 98.6 | 1.4 |
| Comparative Example 5 | 98.6 | 1.4 |
| Comparative Example 6 | 98.6 | 1.4 |
| Comparative Example 7 | 79.1 | 20.9 |
| Comparative Example 8 | 79.1 | 20.9 |
| Comparative Example 9 | 79.1 | 20.9 |
| Comparative Example 10 | 79.1 | 20.9 |
| Comparative Example 11 | 79.1 | 20.9 |
| Comparative Example 12 | 79.1 | 20.9 |
| Comparative Example 13 | 86.5 | 13.5 |
| Comparative Example 14 | 86.5 | 13.5 |
| Comparative Example 15 | 86.5 | 13.5 |
| Comparative Example 16 | 86.5 | 13.5 |
| Comparative Example 17 | 86.5 | 13.5 |
| Comparative Example 18 | 86.5 | 13.5 |

Tungsten wafers were polished using the slurry compositions of Examples 1 through 30 and Comparative Examples 1 through 18 under the following polishing conditions.

[Polishing Conditions]
1. Polishing equipment: CETR CP-4
2. Wafer: 6 cm×6 cm tungsten wafer
3. Platen pressure: 4 psi
4. Spindle speed: 69 rpm
5. Platen speed: 70 rpm
6. Flow rate: 100 ml/min
7. Slurry solid content: 3.5 wt %

FIG. 1 illustrates a topographic image of a surface of a tungsten wafer polished using the slurry composition of Comparative Example 1. Referring to FIG. 1, the surface of the tungsten wafer has a high roughness after the tungsten wafer is polished using the slurry composition of Comparative Example 1. Because the tungsten wafer is excessively etched due to an increase in a chemical etching speed by addition of nitric acid in the slurry composition of Comparative Example 1, the roughness of the surface of the tungsten wafer increases while surface defects, for example, dishing or erosion of the surface occurs.

Figure 2:
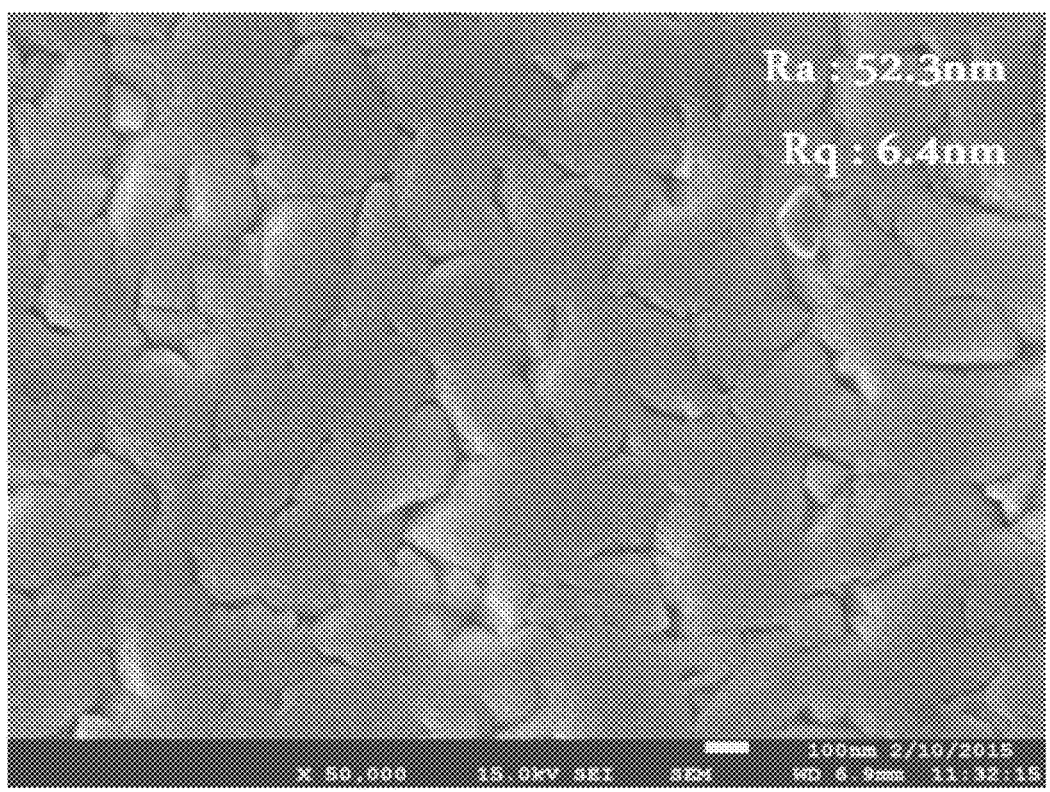
FIG. 2 illustrates a topographic image of a surface of a tungsten wafer polished using a slurry composition for polishing tungsten of Example 1 according to an embodiment.

FIG. 2 illustrates a topographic image of a surface of a tungsten wafer polished using the slurry composition of Example 1. Referring to FIG. 2, a roughness of the surface of the tungsten wafer is remarkably reduced after the tungsten wafer is polished using the slurry composition of Example 1. Thus, it is possible to achieve a desired level of chemical etching by adding an organic acid with an HPI equal to or less than "70" or an HBI equal to or greater than "30" to the slurry composition of Example 1. Also, it is possible to smoothly perform polishing by abrasive particles while adjusting a chemical etching speed.

SER values and particle stability measurement results according to Examples 1 through 30 and Comparative Examples 1 through 18 are shown in Tables 3 and 4 below. Hereinafter, a scheme of measuring stability of abrasive particles is described below.

A tungsten coupon wafer of 2 cm² was immersed for 24 hours in a container filled with a slurry of 30 grams (g) at 60° C. An initial particle size A before immersion and a particle size B after immersion were measured, and the stability was calculated as shown in Equation 4 below.

$$\text{Stability}(\%) = \frac{\text{Particle size after immersion for 24 hours} - \text{Particle size before immersion}}{\text{Particle size before immersion}} \times 100 \quad [\text{Equation 4}]$$

Referring to Tables 3 and 4, the SER values according to Examples 1 through 30 tends to significantly decrease in comparison to Comparative Examples 1 through 18. Also, the stability according to Examples 1 through 30 is very excellent in comparison to Comparative Examples 1 through 18.

TABLE 3

|  | SER (Å/min) | Stability (%) |
| --- | --- | --- |
| Example 1 | 77.6 | 5.24 |
| Example 2 | 74.5 | 6.15 |
| Example 3 | 94.1 | 5.38 |
| Example 4 | 93.5 | 5.93 |
| Example 5 | 68.9 | 6.27 |
| Example 6 | 95.4 | 6.97 |
| Example 7 | 73.5 | 6.14 |
| Example 8 | 81.3 | 6.22 |
| Example 9 | 91.4 | 7.18 |

TABLE 3-continued

|  | SER (Å/min) | Stability (%) |
| --- | --- | --- |
| Example 10 | 88.5 | 7.68 |
| Example 11 | 90.1 | 6.99 |
| Example 12 | 100.3 | 7.54 |
| Example 13 | 87.3 | 6.85 |
| Example 14 | 94.5 | 6.34 |
| Example 15 | 104.6 | 7.15 |
| Example 16 | 103.3 | 6.24 |
| Example 17 | 78.9 | 7.69 |
| Example 18 | 124.1 | 6.83 |
| Example 19 | 70.4 | 8.22 |
| Example 20 | 75.1 | 6.58 |
| Example 21 | 73.5 | 7.41 |
| Example 22 | 78.3 | 7.93 |
| Example 23 | 77.6 | 6.98 |
| Example 24 | 111.6 | 7.23 |
| Example 25 | 83.4 | 7.99 |
| Example 26 | 89.6 | 8.49 |
| Example 27 | 79.1 | 8.13 |
| Example 28 | 83.5 | 8.77 |
| Example 29 | 80.4 | 7.31 |
| Example 30 | 99.3 | 7.55 |

TABLE 4

|  | SER (Å/min) | Stability (%) |
| --- | --- | --- |
| Comparative Example 1 | 99.1 | 40.75 |
| Comparative Example 2 | 102.3 | 64.21 |
| Comparative Example 3 | 88.4 | 59.73 |
| Comparative Example 4 | 100.2 | 62.88 |
| Comparative Example 5 | 113.7 | 76.1 |
| Comparative Example 6 | 135.6 | 70.6 |
| Comparative Example 7 | 179.5 | 91.2 |
| Comparative Example 8 | 223.4 | 130.4 |
| Comparative Example 9 | 161.0 | 105.3 |
| Comparative Example 10 | 143.2 | 121.6 |
| Comparative Example 11 | 246.3 | 101.4 |
| Comparative Example 12 | 256.3 | 129.2 |
| Comparative Example 13 | 145.6 | 73.3 |
| Comparative Example 14 | 165.7 | 73.8 |
| Comparative Example 15 | 151.8 | 686.6 |
| Comparative Example 16 | 140.8 | 75.1 |
| Comparative Example 17 | 165.5 | 80.1 |
| Comparative Example 18 | 193.3 | 76.4 |

According to embodiments, a slurry composition for polishing tungsten may be used to improve topography of tungsten, and thus it is possible to reduce a chemical etching effect by a water-soluble polymer and to reduce surface defects, for example, dishing or erosion, instead of having an influence on a polishing speed. Also, it is possible to provide a slurry for removal of a tungsten film to reach a desired polishing rate while representing a tungsten removal effect by chemical etching.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A slurry composition for polishing tungsten, the slurry composition comprising:
   at least one water-soluble polymer selected from the group consisting of polystyrene sulfonic acid, polyvinyl sulfonic acid, polyacrylamide methylpropane sulfonic acid, poly-α-methylstyrene sulfonic acid, poly-ρ-methylstyrene sulfonic acid and salts thereof, wherein the water-soluble polymer is present in the slurry composition in an amount of from 0.01 wt % to 0.6 wt % based on the total weight of the slurry composition; abrasive particles; and an etching adjuster in an amount of from 0.01 wt % to 0.5 wt % based on the total weight of the slurry composition, wherein the etching adjuster is at least one of a compound having a hydrophilic index (HPI) value equal to or less than "70" and a compound having a hydrophobic index (HBI) value equal to or greater than "30," wherein the HPI value and the HBI value are defined by the following equations:

$$HPI = \frac{\text{Molecular weight of hydrophilic functional group}}{\text{Total Molecular weight of compound}} \times 100, \text{ and}$$

$$HBI = \frac{\text{Molecular weight of hydrophobic functional group}}{\text{Total Molecular weight of compound}} \times 100,$$

wherein a static etch rate (SER) of a surface of tungsten polished using the slurry composition is equal to or less than 150 angstroms per minute (Å/min).

2. The slurry composition of claim 1, wherein the water-soluble polymer is present in an amount of 0.01% by weight (wt %) to 5 wt % in the slurry composition.

3. The slurry composition of claim 1, wherein the abrasive particles comprise at least one selected from the group consisting of a metal oxide, a metal oxide coated with an organic material or inorganic material and the metal oxide in a colloidal phase, and wherein the metal oxide comprises at least one selected from the group consisting of silica, ceria, zirconia, alumina, titania, barium titania, germania, mangania and magnesia.

4. The slurry composition of claim 1, wherein the abrasive particles have a particle size of 20 nanometers (nm) to 250 nm, and comprise abrasive particles having the same particle size or at least two different particle sizes.

5. The slurry composition of claim 1, wherein the abrasive particles are present in an amount of 1 wt % to 5 wt % in the slurry composition.

6. The slurry composition of claim 1, wherein the etching adjuster comprises at least one selected from the group consisting of lactic acid, propionic acid, isovaleric acid, caproic acid, isobutyric acid, valeric acid, butyric acid, cyclopentanecarboxylic acid, hydroxybutyric acid, 4-amino-3-hydroxybutyric acid, dimethylsuccinic acid, methylpentanoic acid, 2-hydroxy-4-methylpentanoic acid and 1-hydroxy-1-cyclopropanecarboxylic acid.

7. The slurry composition of claim 1, wherein the etching adjuster is present in an amount of 0.001 wt % to 1 wt % in the slurry composition.

8. The slurry composition of claim 1, further comprising:
at least one oxidizer selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium persulfate, benzoyl peroxide, calcium peroxide, barium peroxide, sodium peroxide and urea peroxide.

9. The slurry composition of claim 8, wherein the oxidizer is present in an amount of 0.005 wt % to 5 wt % in the slurry composition.

10. The slurry composition of claim 1, further comprising:
at least one pH adjuster selected from the group consisting of:
an acidic material including at least one selected from the group consisting of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof; and
a basic material including at least one selected from the group consisting of ammonia, ammonium methyl propanol (AMP), tetramethylammonium hydroxide (TMAH), potassium hydroxide, sodium hydroxide, magnesium hydroxide, rubidium hydroxide, cesium hydroxide, sodium hydrogen carbonate, sodium carbonate and imidazole.

11. The slurry composition of claim 1, wherein the slurry composition has a pH ranging from 2 to 5.

12. The slurry composition of claim 1, wherein the slurry composition is free of nitric acid.

13. The slurry composition of claim 1, wherein a peak-to-valley roughness Rpv of a surface of tungsten polished using the slurry composition is equal to or less than 100 nm, and a root mean square roughness Rq of the surface is equal to or less than 10 nm.

14. The slurry composition of claim 1, wherein the slurry composition is used to improve topography of tungsten.

15. The slurry composition according to claim 1, having a pH of from 2.8 to 3.5.

16. The slurry composition according to claim 15, wherein the etching adjuster is at least one selected from the group consisting of lactic acid, 4-amino-3-hydroxybutyric acid, propionic acid and 2-hydroxy-butyric acid.

17. The slurry composition according to claim 16, having a particle stability of 5.24% to 8.77% and a static etch rate of from 68.9 to 124.1 Å/min.

18. The slurry composition according to claim 17, wherein the etching adjuster is a compound having a hydrophilic index (HPI) value equal to or less than "70" and a hydrophobic index (HBI) value equal to or greater than "30".

* * * * *